US012563808B2

(12) United States Patent
Chen et al.

(10) Patent No.: US 12,563,808 B2
(45) Date of Patent: Feb. 24, 2026

(54) THIN FILM TRANSISTOR AND MANUFACTURING METHOD THEREOF

(71) Applicant: SHENZHEN CHINA STAR OPTOELECTRONICS SEMICONDUCTOR DISPLAY TECHNOLOGY CO., LTD., Shenzhen (CN)

(72) Inventors: Yuanpeng Chen, Shenzhen (CN); Yuanjun Hsu, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 1228 days.

(21) Appl. No.: 17/419,588

(22) PCT Filed: May 10, 2021

(86) PCT No.: PCT/CN2021/092580
§ 371 (c)(1),
(2) Date: Nov. 3, 2022

(87) PCT Pub. No.: WO2022/227109
PCT Pub. Date: Nov. 3, 2022

(65) Prior Publication Data
US 2024/0047538 A1     Feb. 8, 2024

(30) Foreign Application Priority Data

Apr. 26, 2021     (CN) ......................... 202110454398.6

(51) Int. Cl.
*H10D 64/23*         (2025.01)
*H10D 30/67*         (2025.01)
*H10D 99/00*         (2025.01)

(52) U.S. Cl.
CPC ....... *H10D 64/258* (2025.01); *H10D 30/6729* (2025.01); *H10D 30/6755* (2025.01); *H10D 30/6757* (2025.01); *H10D 99/00* (2025.01)

(58) Field of Classification Search
CPC ............. H10D 64/258; H10D 30/6729; H10D 30/6755; H10D 30/6757; H10D 99/00
See application file for complete search history.

(56) References Cited

U.S. PATENT DOCUMENTS 5,289,030 A   *   2/1994   Yamazaki .......... H10D 30/0314
                                                      257/E21.507
2005/0258488 A1*  11/2005  Chang ..................... H10D 86/40
                                                      257/347
(Continued)

FOREIGN PATENT DOCUMENTS

CN          1691340 A       11/2005
CN          105702744 A      6/2016
(Continued)

OTHER PUBLICATIONS

Chinese Office Action issued in corresponding Chinese Patent Application No. 202110454398.6 dated Apr. 26, 2022, pp. 1-8.
(Continued)

*Primary Examiner* — Fernando L Toledo
*Assistant Examiner* — Shawn Shaw Muslim
(74) *Attorney, Agent, or Firm* — PV IP PC; Peter Stecher; Wei Te Chung

(57)               ABSTRACT

The present application provides a thin film transistor and a manufacturing method thereof. A substrate, an active layer, a first insulating layer, and a gate electrode are stacked and disposed in sequence, the second insulating layer is disposed on the substrate and covers the active layer, the first insulating layer, and the gate electrode. A source electrode and a drain electrode are separately disposed on a side of the second insulating layer away from the gate electrode, and
(Continued)

any one of a projection of the source electrode on the active layer or a projection of the drain electrode on the active layer does not coincide with a projection of the gate electrode on the active layer. Thereby, a parasitic capacitance of the gate electrode and the source electrode can be reduced, and a parasitic capacitance of the gate electrode and the drain electrode can be reduced.

18 Claims, 3 Drawing Sheets

(56)                     References Cited

U.S. PATENT DOCUMENTS

| | | | |
|---|---|---|---|
| 2013/0087781 A1 | 4/2013 | Yeh et al. | |
| 2020/0176604 A1 | 6/2020 | Xu et al. | |
| 2022/0059792 A1* | 2/2022 | Park | H10K 71/00 |

FOREIGN PATENT DOCUMENTS

| | | |
|---|---|---|
| CN | 106981520 A | 7/2017 |
| CN | 107516471 A | 12/2017 |
| CN | 108288586 A | 7/2018 |
| CN | 109686793 A | 4/2019 |
| CN | 110993651 A | 4/2020 |
| CN | 112510053 A | 3/2021 |
| KR | 20160039090 A | 4/2016 |

OTHER PUBLICATIONS

International Search Report in International application No. PCT/CN2021/092580, mailed on Jan. 26, 2022.

Written Opinion of the International Searching Authority in International application No. PCT/CN2021/092580, mailed on Jan. 26, 2022.

* cited by examiner

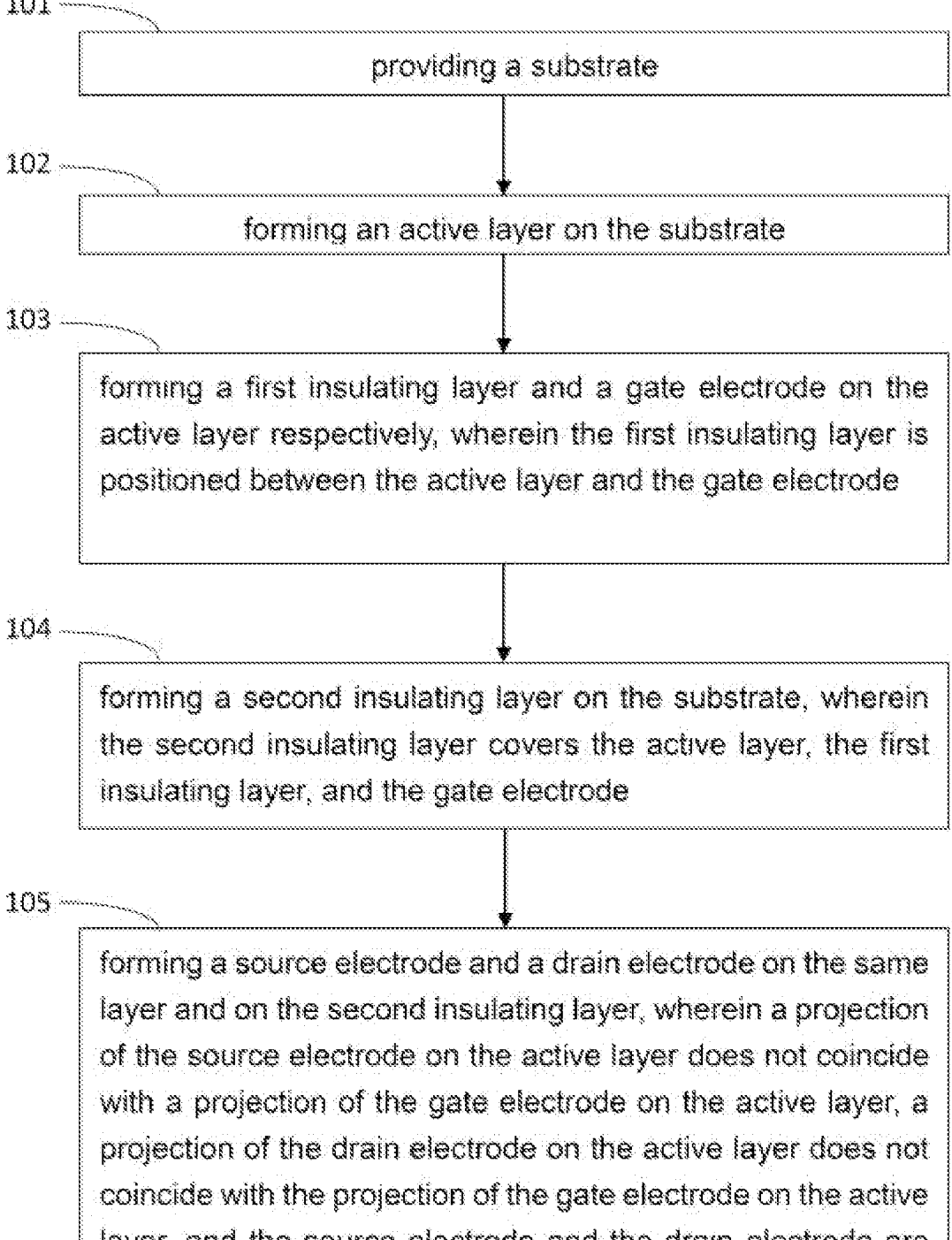

101 ── providing a substrate

102 ── forming an active layer on the substrate

103 ── forming a first insulating layer and a gate electrode on the active layer respectively, wherein the first insulating layer is positioned between the active layer and the gate electrode

104 ── forming a second insulating layer on the substrate, wherein the second insulating layer covers the active layer, the first insulating layer, and the gate electrode

105 ── forming a source electrode and a drain electrode on the same layer and on the second insulating layer, wherein a projection of the source electrode on the active layer does not coincide with a projection of the gate electrode on the active layer, a projection of the drain electrode on the active layer does not coincide with the projection of the gate electrode on the active layer, and the source electrode and the drain electrode are both passes through the second insulating layer and electrically connected to the active layer

FIG. 4

THIN FILM TRANSISTOR AND MANUFACTURING METHOD THEREOF

RELATED APPLICATIONS

This application is a Notional Phase of PCT Patent Application No. PCT/CN2021/092580 having international filing date of May 10, 2021, which claims the benefit of priority of Chinese Patent Application No. 202110454398.6 filed on Apr. 26, 2021. The contents of the above applications are all incorporated by reference as if fully set forth herein in their entirety.

FIELD OF INVENTION

The present application relates to a field of display technology and more particularly to a thin film transistor and a manufacturing method thereof.

BACKGROUND OF INVENTION

With the development of display technology, thin film transistors (TFTs) are widely used in display driving back plate. The TFTs can be manufactured by adopting oxide semiconductors or low temperature poly-silicon (LTPS).

The oxide semiconductor TFTs have high mobility and can provide sufficient drive current. Comparing the oxide semiconductor TFTs with low-temperature polysilicon TFTs, the oxide semiconductor TFTs are compatible with low-temperature manufacturing processes and can achieve high mobility in an amorphous state to ensure large region uniformity.

The oxide semiconductor TFTs are currently widely used because of their relatively simple structure and relatively simple process technology, but are confronted with a problem of large parasitic capacitance.

SUMMARY OF INVENTION

The embodiments of the present application provide a thin film transistor and a manufacturing method thereof, to reduce a parasitic capacitance of the thin film transistor.

In a first aspect, the embodiments of the present application provide a thin film transistor, including:

a substrate;

an active layer disposed on the substrate;

a first insulating layer disposed on the active layer;

a gate electrode disposed on the first insulating layer, wherein a projection of the gate electrode on the first insulating layer is positioned in the first insulating layer or coincides with the first insulating layer;

a second insulating layer disposed on the substrate and covering the active layer, the first insulating layer, and the gate electrode;

a source electrode disposed on a side of the second insulating layer away from the gate electrode, wherein the source electrode passes through the second insulating layer and is electrically connected to the active layer, and a projection of the source electrode on the active layer does not coincide with a projection of the gate electrode on the active layer; and a drain electrode disposed on the side of the second insulating layer away from the gate electrode and disposed in a same layer as the source electrode, wherein the drain electrode passes through the second insulating layer and is electrically connected to the active layer, and a projection of the drain electrode on the active layer does not coincide with the projection of the gate electrode on the active layer.

In a second aspect, the embodiments of the present application also provide a method of manufacturing a thin film transistor, including steps of:

providing a substrate;

forming an active layer on the substrate;

forming a first insulating layer and a gate electrode on the active layer respectively, wherein the first insulating layer is positioned between the active layer and the gate electrode, and wherein a projection of the gate electrode on the first insulating layer is positioned in the first insulating layer or coincides with the first insulating layer;

forming a second insulating layer on the substrate, wherein the second insulating layer covers the active layer, the first insulating layer, and the gate electrode;

forming a source electrode and a drain electrode on the same layer and on the second insulating layer, wherein a projection of the source electrode on the active layer does not coincide with a projection of the gate electrode on the active layer, a projection of the drain electrode on the active layer does not coincide with the projection of the gate electrode on the active layer, and the source electrode and the drain electrode both pass through the second insulating layer and are electrically connected to the active layer.

In the embodiments of the present application, the source electrode and the drain electrode are disposed and separated on a side of the second insulating layer away from the gate electrode, a projection of the source electrode on the active layer does not coincide with a projection of the gate electrode on the active layer, and a projection of the drain electrode on the active layer does not coincide with the projection of the gate electrode on the active layer. By preventing the projection of the source electrode on the active layer from coinciding with the projection of the gate electrode on the active layer, and preventing the projection of the drain electrode on the active layer from coinciding with the projection of the gate electrode on the active layer, a parasitic capacitance between the gate electrode and the source electrode and a parasitic capacitance between the gate electrode and the drain electrode can be reduced, and a charging characteristic of the display panel can be improved.

DESCRIPTION OF FIGURES

In order to more clearly describe the technical solutions in the embodiments of the present application, the following will briefly introduce the figures that need to be used in the description of the embodiments. Obviously, the figures in the following description are only some embodiments of the present application, and for those skilled in the art, other figures can be obtained based on these figures without inventive steps.

In order to have a more complete understanding of the present application and the beneficial effects thereof, the description will be provided below in conjunction with the accompanying figures. The same reference numerals in the following description indicate the same portions.

FIG. 4 is a schematic flow chart of a method of manufacturing the thin film transistor provided by one embodiment of the present application.

DETAILED DESCRIPTION OF EMBODIMENTS

The technical solutions in the embodiments of the present application will be clearly and completely described below in conjunction with the figures in the embodiments of the present application. Obviously, the described embodiments are only a part of the embodiments of the present application, rather than all the embodiments. Based on the embodiments in the present application, all other embodiments obtained by those skilled in the art without inventive steps shall fall within a protection scope of the present application.

The current oxide semiconductor TFTs are generally manufactured by adopting a bottom gate structure. A gate electrode is disposed on a substrate, an active layer is disposed on the gate electrode, and an insulating layer is configured to separate the gate electrode and the active layer. A source electrode and a drain electrode are disposed and separated on the active layer. The bottom gate structure is widely used due to its relatively simple manufacturing process. However, due to a projection of the source electrode on the active layer coinciding with a projection of the gate electrode on the active layer, a projection of the drain electrode on the active layer coincides with a projection of the gate electrode, thereby the current oxide semiconductor TFTs are confronted with a problem of large parasitic capacitance between the source electrode and the gate electrode, and are confronted with a problem of large parasitic capacitance between the drain electrode and the gate electrode.

One embodiment of the present application provides a thin film transistor and a method of manufacturing the thin film transistor. The thin film transistor is manufactured by adopting a top gate structure, wherein an active layer is disposed on a substrate, a gate electrode is disposed on the active layer, a first insulating layer is configured to separate a source electrode and a drain electrode which are disposed on a side of a second insulating layer away from the gate electrode, and wherein a projection of the source electrode on the active layer does not coincide with a projection of the gate electrode on the active layer, and a projection of the drain electrode on the active layer does not coincide with the projection of the gate electrode on the active layer. By preventing an overlap of the projections of the source electrode, the drain electrode, and the gate electrode on the active layer, a parasitic capacitance between the gate electrode and the source electrode and a parasitic capacitance between the gate electrode and the drain electrode can be reduced. The following will describe the thin film transistor and the method of manufacturing the thin film transistor respectively with reference to the accompanying figures.

Figure 1:
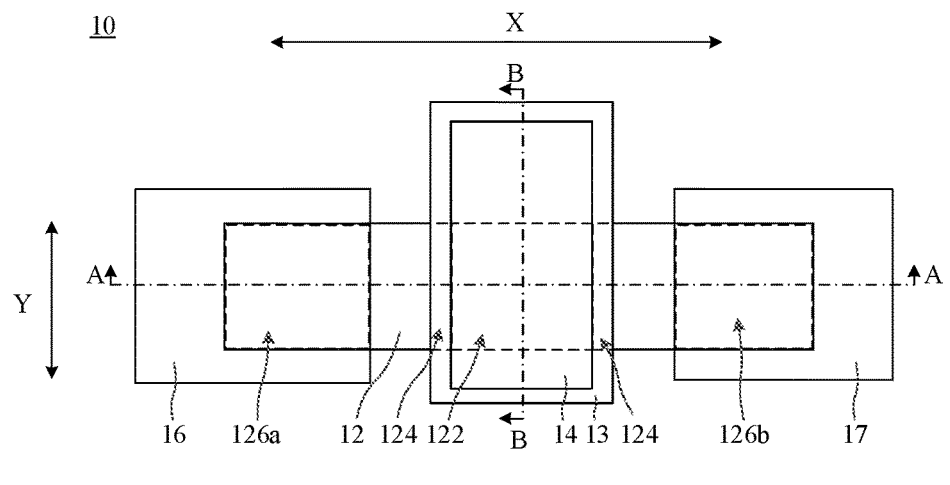
FIG. 1 is a schematic diagram of a structure of a thin film transistor provided by one embodiment of the present application.
Figure 2:
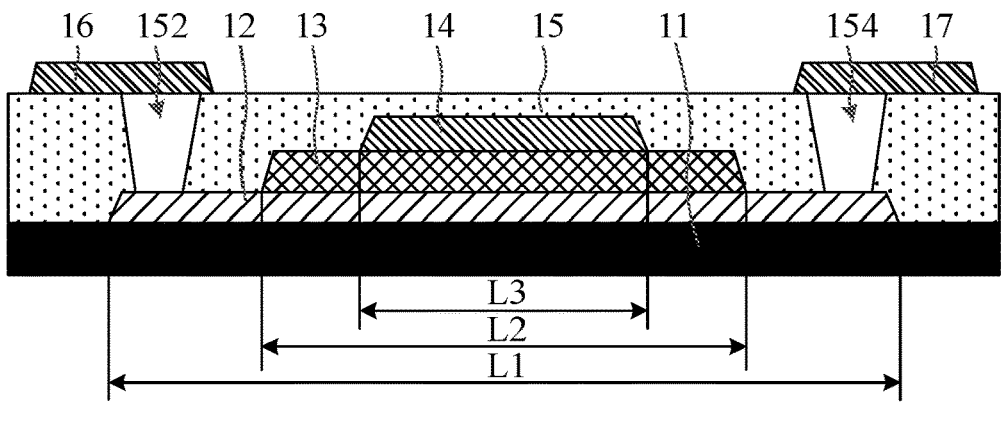
FIG. 2 is a schematic cross-sectional view of the thin film transistor shown in FIG. 1 along an A-A direction.
Figure 3:
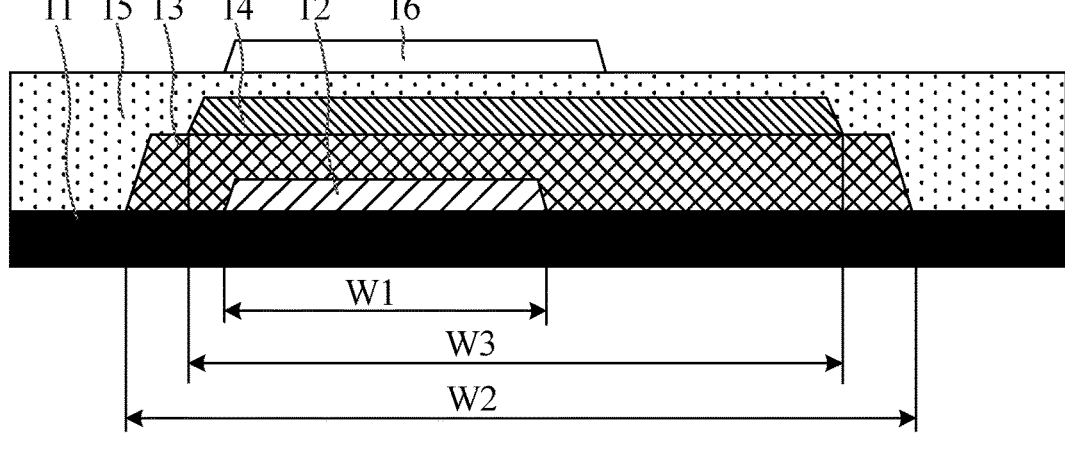
FIG. 3 is a schematic cross-sectional view of the thin film transistor shown in FIG. 1 along a B-B direction.

One embodiment of the present application provides a thin film transistor. For details, please refer to FIGS. 1 to 3. FIG. 1 is a schematic diagram of a structure of a thin film transistor provided by one embodiment of the present application, FIG. 2 is a schematic cross-sectional view of the thin film transistor shown in FIG. 1 along an A-A direction, and FIG. 3 is a schematic cross-sectional view of the thin film transistor shown in FIG. 1 along a B-B direction, wherein FIG. 1 does not show a first insulating layer and a second insulating layer. The thin film transistor 10 at least includes a substrate 11, an active layer 12, a first insulating layer 13, a gate electrode 14, a second insulating layer 15, a source electrode 16, and a drain electrode 17. The active layer 12 is disposed on the substrate 11, the first insulating layer 13 is disposed on the active layer 12, and the gate electrode 14 is disposed on the first insulating layer 13. It can be understood that the substrate 11, the active layer 12, the first insulating layer 13, and the gate electrode 14 are stacked in sequence. A projection of the gate electrode 14 on the first insulating layer 13 is positioned in the first insulating layer 13 or coincides with the first insulating layer 13. That is, an area of the gate electrode 14 can be less than or equal to an area of the first insulating layer 13, to make a better insulation effect between the gate electrode 14 and the active layer 12. The second insulating layer 15 is disposed on the substrate 11 and covers the active layer 12, the first insulating layer 13, and the gate electrode 14. The source electrode 16 is disposed on a side of the second insulating layer 15 away from the gate electrode 14. The source electrode 16 is electrically connected to the active layer 12 by passing through the second insulating layer 15. A projection of the source electrode 16 on the active layer 12 does not coincide with a projection of the gate electrode 14 on the active layer 12. The drain electrode 17 is disposed on the side of the second insulating layer 15 away from the gate electrode 14 and is disposed in the same layer as the source electrode 16, wherein the drain electrode 17 passes through the second insulating layer 15 and is electrically connected to the active layer 12. A projection of the drain electrode 17 on the active layer 12 does not coincide with the projection of the gate electrode 14 on the active layer 12. By preventing the projection of the source electrode 16 on the active layer 12 from coinciding with the projection of the gate electrode 14 on the active layer 12, and preventing the projection of the drain electrode 17 on the active layer 12 from coinciding with the projection of the gate electrode 14 on the active layer 12, a parasitic capacitance between the gate electrode 14 and the source electrode 16 and a parasitic capacitance between the gate electrode 14 and the drain electrode 17 can be reduced, and a charging characteristic of the display panel can be improved.

The active layer 12 is also called a semiconductor layer or a semiconductor active layer, and the active layer 12 may be manufactured by an oxide semiconductor material. A shape of the substrate 11 may be square, the active layer 12 may be a rectangular island-shaped structure, and the active layer 12 is positioned in a partial region of the substrate 11.

The first insulating layer 13 may also be referred to as a gate insulating layer to insulate the gate electrode 14 and the active layer 12. The first insulating layer 13 may be an island structure with rectangular shape, and the first insulating layer 13 may be disposed to overlap with the active layer 12. It can be understood that a partial region of the first insulating layer 13 coincides with a portion region of the active layer 12.

The gate electrode 14 may be an island structure with rectangular shape, and a shape of the gate electrode 14 is similar to a shape of the first insulating layer 13.

The second insulating layer 15 is also called an interlayer insulating layer, and is configured to insulate the source electrode 16 and the drain electrode 17 from the active layer 12, the first insulating layer 13, and the gate electrode 14 which are covered by the second insulating layer 15. The second insulating layer 15 is provided with a first through-hole 152 and a second through-hole 154, two terminals of the first through-hole 152 are the active layer 12 and the source electrode 16, respectively, and two terminals of the second through-hole 154 are the active layer 12 and the drain electrode 17, respectively. It should be noted that an electrical connection between the source electrode 16 and the active layer 12 is achieved by a metal connector disposed in the first through-hole 152, and an electrical connection between the drain electrode 17 and the active layer 12 is achieved by a metal connector disposed in the second through-hole 154.

In order to explain the structure of the thin film transistor 10 more clearly, the thin film transistor 10 will be described from different aspects below.

Please continue to refer to FIG. 1, which can be understood as a direction of a top view of the thin film transistor 10. The projection of the gate electrode 14 on the first insulating layer 13 is positioned in the first insulating layer 13, that is, a pattern area of the gate electrode 14 is smaller than a pattern area of the first insulating layer 13. The active layer 12 includes a channel region 122, a transition region 124, a conductor region 126$a$, and a conductor region 126$b$. The projection of the gate electrode 14 on the active layer 12 is served as the channel region 122 of the active layer 12, and a projection of a region where the first insulating layer 13 does not overlap the gate electrode 14 on the active layer 12 serves as the transition region 124 of the active layer 12. The projection of the source electrode 16 on the active layer 12 serves as the conductor region 126$a$ of the active layer 12, and the projection of the drain electrode 17 on the active layer 12 serves as the conductor region 126$b$ of the active layer 12. Due to the arrangement of the gate electrode 14 and the first insulating layer 13 on the channel region 122 of the active layer 12, a top incident light can be blocked from irradiating the channel region 122 of the active layer 12, thereby the light stability of the oxide semiconductor TFT can be improved.

A conductivity of the conductor region 126$a$ and a conductivity of the conductor region 126$b$ are better than a conductivity of the transition region 124, and the conductivity of the transition region 124 is better than the conductivity of the channel region 122. This is achieved through a conductorization process to control the conductivities of each portion. The gate electrode 14 is configured to control a conduction of the channel region 122, the conductive region 126$a$ is electrically connected to the source electrode 16, and the conductive region 126$b$ is electrically connected to the drain electrode 17. The gate electrode 14 can be understood as a switch, when a voltage is applied to the gate electrode 14, the gate electrode 14 will attract the charge in the channel region 122 to generate a current and then turn on the source electrode 16 and the drain electrode 17, so that the thin film transistor 10 enters an operation state. When the voltage is removed, the gate electrode 14 does not attract the charges in the channel region 122, and thus does not turn on the source electrode 16 and the drain electrode 17, so that the thin film transistor 10 enters a non-operating state.

Please continue to refer to FIG. 2, a length L1 of the active layer 12 in a longitudinal direction X of the active layer 12 is greater than a length L2 of the first insulating layer 13 in the longitudinal direction X, and a length L2 of the first insulating layer 13 in the longitudinal direction X is greater than a length L3 of the gate electrode 14 in the longitudinal direction X. The gate electrode 14 is positioned between the source electrode 16 and the drain electrode 17 in a spatial position.

Exemplarily, a distance between an edge on a side of the gate electrode 14 facing the source electrode 16 and an edge on a side of the first insulating layer 13 facing the source electrode 16 ranges from 0.5 μm to 1.5 μm, and a distance between an edge on a side of the gate electrode 14 facing the drain electrode 17 and an edge on a side of the first insulating layer 13 facing the drain electrode 17 ranges from 0.5 μm to 1.5 μm. It can be understood that the distance between the edge on the side of the gate electrode 14 facing the source electrode 16 and the edge on the side of the first insulating layer 13 facing the source electrode 16, and the distance between the edge on the side of the gate electrode 14 facing the drain electrode 17 and the edge on the side of the first insulating layer 13 facing the drain electrode 17 are half of the length L2 of the first insulating layer 13 minus the length L3 of the gate electrode 14. This arrangement isolates the gate electrode 14 and the active layer 12 better and prevents a mutual influence between the gate electrode 14 and the active layer 12.

Exemplarily, a distance between an edge on a side of the gate electrode 14 facing the source electrode 16 and an edge on a side of the first insulating layer 13 facing the source electrode 16 is greater than or equal to 0.5 μm, and a distance between an edge on a side of the gate electrode 14 facing the drain electrode 17 and an edge on a side of the first insulating layer 13 facing the drain electrode 17 is greater than or equal to 0.5 μm. It can be understood that a connection position of the source electrode 16 and the active layer 12 spaced a certain distance to the channel region 122, and a connection position of the drain electrode 17 and the active layer 12 spaced a certain distance to the channel region 122, by disposing a distance between the source electrode 16 and the channel region 122, and disposing a distance between the drain electrode 17 and the channel region 122, a problem of performance degradation of the thin film transistor 10 due to carrier diffusion can be relieved.

Please continue to refer to FIG. 3, a width W2 of the first insulating layer 13 in a width direction Y of the active layer 12 is greater than a width W3 of the gate electrode 14 in the width direction Y of the active layer 12, and the width W3 of the gate electrode 14 in the width direction Y of the active layer 12 is greater than a width W1 of the active layer 12 in the width direction Y of the active layer 12, and wherein the active layer 12 is close to one terminal of the gate electrode 14 and the projection of the gate electrode 14 on the active layer 12 completely covers the active layer 12.

In the embodiment of the present application, please continue to refer to FIGS. 1 to 3, the projection of the source electrode 16 on the active layer 12 is separated from the projection of the gate electrode 14 on the active layer 12, and the projection of the drain electrode 17 on the active layer 12 is separated from the projection of the gate electrode 14 on the active layer 12. In this way, the parasitic capacitance between the gate electrode 14 and the source electrode 16 and the parasitic capacitance between the gate electrode 14 and the drain electrode 17 can be reduced.

The projection of the source electrode 16 on the active layer 12 is separated from the projection of the first insulating layer 13 on the active layer 12, and the projection of the drain electrode 17 on the active layer 12 is separated from the projection of the first insulating layer 13 on the active layer 12. At this time, regardless of the area relationship between the gate electrode 14 and the first insulating layer 13, the projection of the gate electrode 14 on the active layer 12 not coinciding with the source electrode 16 on the active layer 12 can be achieved, thereby the parasitic capacitance between the gate electrode 14 and the source electrode 16 can be reduced; and the projection of the gate electrode 14 on the active layer 12 not coinciding with the source electrode 16 on the active layer 12 can be achieved, thereby the parasitic capacitance between the gate electrode 14 and the source electrode 16 can be reduced; and the projection of the gate electrode 14 on the active layer 12 not coinciding with the drain electrode 17 on the active layer 12 can be achieved, thereby the parasitic capacitance between the gate electrode 14 and the source electrode 17 can be reduced. It should be noted that in some other embodiments, the projection of the source electrode 16 on the active layer 12 can also be adjacent to the projection of the first insulating layer 13 on the active layer 12. Similarly, the projection of the drain electrode 17 on the active layer 12 can also be adjacent to the projection of the first insulating layer 13 on the active layer 12. In this case, the projection of the gate electrode 14 on the first insulating layer 13 is positioned in the first insulating layer 13, which can ensure that the projection of the source electrode 16 on the active layer 12 is separated from the projection of the gate electrode 14 on the active layer 12, and can ensure that the projection of the drain electrode 17 on the active layer 12 is separated from the projection of the gate electrode 14 on the active layer 12.

It should be noted that in some other embodiments, the projection of the source electrode 16 on the active layer 12 may be adjacent to the projection of the gate electrode 14 on the active layer 12, and the projection of the drain electrode 17 on the active layer 12 may be adjacent to the projection of the gate electrode 14 on the active layer 12. At this time, the projection of the source electrode 16 on the active layer 12 can be spaced apart, adjacent to, and overlapped with the projection of the first insulating layer 13 on the active layer 12; and the projection of the drain electrode 17 on the active layer 12 can be spaced apart, adjacent to, and overlapped with the projection of the first insulating layer 13 on the active layer 12. A relationship between the area of the corresponding to the gate electrode 14 may be greater than, approximately equal to, and less than the area of the first insulating layer 13, which are not limited on here, and will not be repeatedly described.

Figure 5:
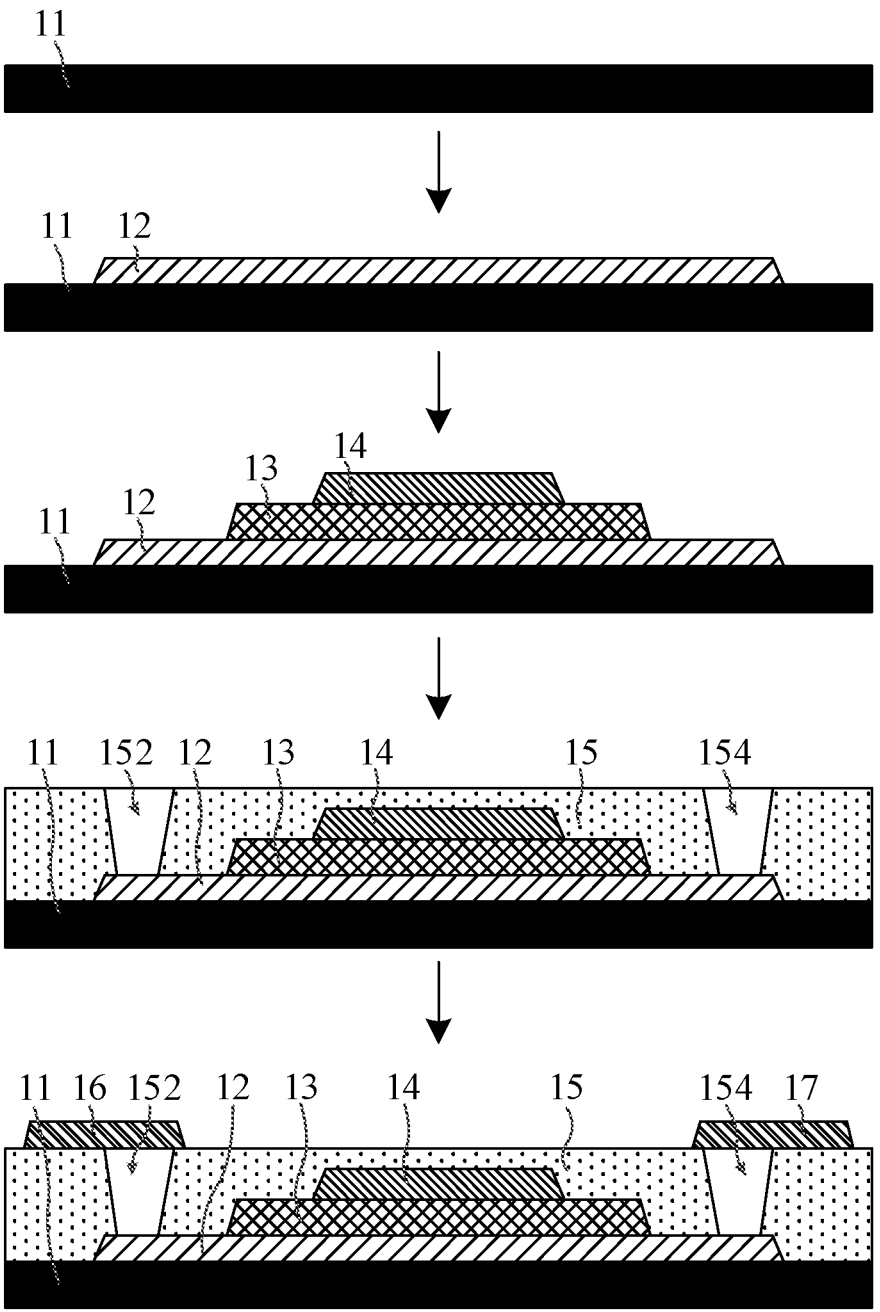
FIG. 5 is a schematic diagram of a process of manufacturing the thin film transistor provided by one embodiment of the present application.

The embodiment of the present application also provides a method of manufacturing a thin film transistor. For details, please refer to FIG. 4 and FIG. 5. FIG. 4 is a schematic flow chart of a method of manufacturing the thin film transistor provided by one embodiment of the present application, and FIG. 5 is a schematic diagram of a process of manufacturing the thin film transistor provided by one embodiment of the present application. The description will be made with reference to the thin film transistor 10 in FIG. 1. The method of manufacturing the thin film transistor includes steps of:

101: Providing a substrate.

A material of the substrate 11 may be glass, and a substrate 11 is provided and cleaned to facilitate subsequent manufacturing processes.

102: Forming an active layer on the substrate.

After cleaning the substrate 11, a buffer layer may be deposited. A material of the buffer layer may be a single layer of $Si_3N_4$, $SiO_2$, or SiON, or a double layer film of $Si_3N_4$, $SiO_2$ and SiON. A thickness of the deposited buffer layer ranges from 1000 A to 5000 A to reduce an influence of the substrate 11 on the active layer 12.

Depositing the active layer material, for example, depositing an oxide semiconductor material, and the active layer material covers the buffer layer. A thickness of the active layer material ranges from 100 A to 1000 A. The active layer material is patterned to form the active layer 12. The active layer 12 includes a channel region 122, a transition region 124, a conductor region 126a, and a conductor region 126b.

103: Forming a first insulating layer and a gate electrode on the active layer respectively, wherein the first insulating layer is positioned between the active layer and the gate electrode.

Depositing a material of the first insulating layer, for example, the material of the first insulating layer 13 can be a $SiO_2$ film covering an entire pattern of the active layer 12, and a thickness of the material deposition of the first insulating layer 13 ranges from 1000 A to 3000 A.

Depositing a gate layer material, for example, depositing the gate layer material and adopting a double-layer structure and covering the material of first insulating layer, wherein a material of a first layer may be a transition metal material, such as Mo, Ti, W, Cr, Ni, and alloy materials of the above metals, and a thickness of the first layer ranges from 50 A to 500 A, and wherein a material of a second layer may be a metal layer material, such as Cu and Al, and a thickness of the second layer material ranges from 2000 A to 5000 A.

Using a photomask is to define the gate electrode 14, for example, the gate electrode 14 can be firstly etched by a wet method, and then the first insulating layer 13 can be dry-etched by self-aligning a pattern of the gate electrode 14. Exemplarily, an organic photoresist can be combined with a photomask to define a size of the gate electrode 14, and a distance between the gate electrode 14 and the organic photoresist in a longitudinal direction of the active layer 12 on the same side of edges can be controlled between 0.3 μm to 2 μm. When dry etching the first insulating layer 13, process parameters of the dry etching can be adjusted, so that the distance between the organic photoresist and the first insulating layer 13 on the same side in the longitudinal direction of the active layer 12 can be controlled to be 0 μm to 1 μm. By adjusting the etching time of the wet etching, a pattern of the gate electrode 14 is finally formed smaller than a pattern of the first insulating layer 13. In the longitudinal direction of the active layer 12, a distance between an edge on a side of the gate electrode 14 facing the source electrode 16 and an edge on a side of the first insulating layer 13 facing the source electrode 16 ranges from to 1.5 μm, and a distance between an edge on a side of the gate electrode 14 facing the drain electrode 17 and an edge of the first insulating layer 13 facing the drain electrode 17 ranges from 0.5 μm to 1.5 μm.

Using plasma to process a portion of the active layer 12 which is not covered by the first insulating layer 13 to form a conductor region 126a and a conductor region 126b, the conductor region 126a is configured to contact the source electrode 16, and the conductor region 126b is configured to contact the drain electrode 17. A portion of the active layer 12 covered by the first insulating layer 13 is not processed and serves as the channel region 122 of the active layer 12. Since the conductor region 126a and the conductor region 126b are subjected to plasma treatment, there will be diffusion at a boundary where the first insulating layer 13 is projected on the active layer 12. Therefore, a transition region 124 is provided between the channel region 122 and the conductor region 126a, and between the channel region 122 and the conductor region 126b, to reduce the influence of the conductor region 126a and the conductor region 126b on the conductivity of the channel region 122. Through the control of the conductorization process, it can be realized that the conductivity of the conductor region 126a and the conductivity of the conductor region 126b are better than the conductivity of the transition region 124, and the conductivity of the transition region 124 is better than the conductivity of the channel region 122. In addition, since the definitions of the conductor region 126a and the conductor region 126b, the transition region 124, and the channel region 122 are defined through the projection of the gate electrode 14 and the first insulating layer 13 on the active layer 12, that is, the projection of the gate electrode 14 on the active layer 12 is configured to the channel region 122 of the active layer 12, the projection of the region where the first insulating layer 13 do not overlap the gate electrode 14 on the active layer 12 is configured to the transition region 124 of the active layer 12, and the projections of the source electrode 16 and the drain electrode 17 on the active layer 12 are configured to the conductor region 126a and the conductor region 126b of the active layer 12, therefore, when the projection of the gate electrode 14 on the first insulating layer 13 is positioned in the first insulating layer 13, the transition region 124 can exist, and the transition region 124 can be conveniently manufactured.

Exemplarily, by adjusting the process parameters of the conductorization, a width of the transition region 124 near the conductor region 126a in the longitudinal direction of the active layer 12 and a width of the transition region 124 near the conductor region 126b in the longitudinal direction of the active layer 12 can be controlled to be 0.82 m to 1.5 μm. In addition, a distance between an edge on a side of the source electrode 16 facing the first insulating layer 13 and an edge on a side of the first insulating layer 13 facing the source electrode 16 is greater than or equal to 0.5 μm, and a distance between an edge on a side of the drain electrode 17 facing the first insulating layer 13 and an edge on a side of the first insulating layer 13 facing the drain electrode 17 is greater than or equal to 0.5 μm. By disposing a distance between the source electrode 16 and the channel region 122 and disposing a distance between the drain electrode 17 and the channel region 122, the problem of performance degradation of the thin film transistor 10 due to carrier diffusion can be relieved.

104: Forming a second insulating layer on the substrate, wherein the second insulating layer covers the active layer, the first insulating layer, and the gate electrode.

Depositing a material of the second insulating layer, the material of the second insulating layer can be a $SiO_2$ film, and a deposition thickness of the second insulating layer ranges from 3000 A to 10000 A. The second insulating layer 15 covers the active layer 12, the first insulating layer 13, and the gate electrode 14, so that the active layer 12, the first insulating layer 13, and the gate electrode 14 are insulated from the outside.

Using a patterning process, for example, respectively etching the first through-hole 152 and the second through-hole 154 of the second insulating layer 15, wherein the first through-hole 152 is configured to place a metal connector to connect the source electrode 16 and the conductor region 126a of the active layer 12, and the second through-hole 154 is configured to place a metal connector to connect the drain electrode 17 and the conductor region 126b of the active layer 12.

105: Forming a source electrode and a drain electrode on the same layer and on the second insulating layer, wherein a projection of the source electrode on the active layer does not coincide with a projection of the gate electrode on the active layer, a projection of the drain electrode on the active layer does not coincide with the projection of the gate electrode on the active layer, and the source electrode and the drain electrode both pass through the second insulating layer and are electrically connected to the active layer.

The source/drain metal layer are deposited with a double-layer metal structure, wherein a material of a first layer may be a transition metal material, such as Mo, Ti, W, Cr, Ni, and alloy materials of the above metals, and the material of a first layer may be a conductive oxide material, such as ITO, IZO, and AZO. A thickness of the first layer ranges from 50 A to 500 A. A material of a second layer may be a metal layer material, such as Cu and Al. A thickness of the second layer material ranges from 2000 A to 10000 A. The source electrode 16 and the drain electrode 17 can be defined by using the same mask as the gate electrode 14, ensuring that a projection of the source electrode 16 on the active layer 12 does not coincide with a projection of the gate electrode 14 on the active layer 12, and ensuring that a projection of the drain electrode 17 on the active layer 12 does not coincide with the projection of the gate electrode 14 on the active layer 12.

After the step of forming the source electrode 16 and the drain electrode 17, the method of manufacturing the thin film transistor further includes: depositing a passivation layer material, wherein the passivation layer material can be a $SiO_2$ film, and a deposition thickness ranges from 1000 A to 5000 A. The passivation layer is configured to protect the active layer 12 and reduce an external influence on the oxide semiconductor of the active layer 12.

The projection of the source electrode 16 on the active layer 12 not coinciding with the projection of the gate electrode 14 on the active layer 12 can be understood as being spaced and adjacent, and the projection of the drain electrode 17 on the active layer 12 not coinciding with the projection of the gate electrode 14 on the active layer 12 can also be understood as being spaced and adjacent. Refer to the description in the foregoing embodiment for the space and adjacent situations, and details are not described herein again.

The thin film transistor and the manufacturing method thereof provided in the embodiments of the present application adopt a top gate structure. The projection of the source electrode on the active layer does not coincide with the projection of the gate electrode on the active layer, and the projection of the drain electrode on the active layer does not coincide with the projection of the gate electrode on the active layer. By preventing the projection of the source electrode on the active layer from coinciding with the projection of the gate electrode on the active layer, and preventing the projection of the drain electrode on the active layer from coinciding with the projection of the gate electrode 14 on the active layer, a parasitic capacitance between the gate electrode and the source electrode and a parasitic capacitance between the gate electrode and the drain electrode can be reduced, and a charging characteristic of the display panel can be improved. In addition, the design of the top gate structure, that is, the arrangement of the gate electrode and the gate insulating layer on the channel region of the active layer, can block a top incident light from irradiating the channel region of the active layer 12, thereby the light stability of the oxide semiconductor TFT can be improved. Combining the above can significantly relieve the performance problem of reduced refresh rate of an active-matrix organic light-emitting diode (AMOLED) back plate due to parasitic capacitance, and can relieve performance problem of reduced reliability caused by light irradiating.

In the above-mentioned embodiments, the description of each embodiment has its own emphasis. For parts that are not described in detail in one embodiment, reference may be made to related descriptions of other embodiments.

In the description of the present application, the terms "first" and "second" are only used for descriptive purposes, and cannot be understood as indicating or implying relative importance or implicitly indicating the number of indicated technical features. Therefore, the features defined with "first" and "second" may explicitly or implicitly include one or more features.

The thin film transistor provided by the embodiments of the present application and a method of manufacturing the thin film transistor are described in detail above. Specific embodiments are used in the specification to illustrate the principles and implementations of the present application. The descriptions of the above embodiments are only used to help understand the present application, method and core idea of the present application. At the same time, for those skilled in the art, according to the idea of the present application, there will be changes in the specific implementation and scope of present application. In summary, the content of this specification should not be construed as a limitation to the present application.

What is claimed is:

1. A thin film transistor, comprising:

a substrate;

an active layer disposed on the substrate;

a first insulating layer disposed on a side of the active layer away from the substrate;

a gate electrode disposed on a side of the first insulating layer away from the substrate, wherein an orthographic projection of the gate electrode on the first insulating layer is positioned in the first insulating layer or coincides with the first insulating layer;

a second insulating layer disposed on the substrate and covering the active layer, the first insulating layer, and the gate electrode;

a source electrode disposed on a side of the second insulating layer away from the gate electrode, wherein the source electrode passes through the second insulating layer and is electrically connected to the active layer, and an orthographic projection of the source electrode on the active layer does not overlap with an orthographic projection of the gate electrode on the active layer; and a drain electrode disposed on the side of the second insulating layer away from the gate electrode and disposed in a same layer as the source electrode, wherein the drain electrode passes through the second insulating layer and is electrically connected to the active layer, and an orthographic projection of the drain electrode on the active layer does not overlap with the orthographic projection of the gate electrode on the active layer, wherein, in a thickness direction of the substrate, a bottom surface of the source electrode close to the substrate is further from the substrate than a top surface of the gate electrode away from the substrate; and in a width direction of the active layer, a width of the first insulating layer is greater than a width of the gate electrode, the width of the gate electrode is greater than a width of the active layer, the active layer is disposed close to an end of the gate electrode and away from another end of the gate electrode, and the orthographic projection of the gate electrode on the active layer completely covers the active layer.

2. The thin film transistor according to claim 1, wherein the orthographic projection of the source electrode on the active layer is separated from the orthographic projection of the gate electrode on the active layer, and the orthographic projection of the drain electrode on the active layer is separated from the orthographic projection of the gate electrode on the active layer.

3. The thin film transistor according to claim 2, wherein the orthographic projection of the source electrode on the active layer is separated from an orthographic projection of the first insulating layer on the active layer, and the orthographic projection of the drain electrode on the active layer is separated from the orthographic projection of the first insulating layer on the active layer.

4. The thin film transistor according to claim 2, wherein the orthographic projection of the source electrode on the active layer is adjacent to an orthographic projection of the first insulating layer on the active layer, and the orthographic projection of the drain electrode on the active layer is adjacent to the orthographic projection of the first insulating layer on the active layer, and wherein the orthographic projection of the gate electrode on the first insulating layer is positioned in the first insulating layer.

5. The thin film transistor according to claim 1, wherein the orthographic projection of the gate electrode on the first insulating layer is positioned in the first insulating layer, the orthographic projection of the gate electrode on the active layer corresponds to a channel region of the active layer, an orthographic projection of a part of the first insulating layer non-overlapping the gate electrode on the active layer corresponds to a transition region of the active layer, and the orthographic projection of the source electrode on the active layer and the orthographic projection of the drain electrode on the active layer correspond to a conductor region of the active layer, and wherein an electrical conductivity of the conductor region is greater than an electrical conductivity of the transition region, and the electrical conductivity of the transition region is greater than an electrical conductivity of the channel region.

6. The thin film transistor according to claim 5, wherein, in a longitudinal direction of the active layer, a length of the active layer is greater than a length of the first insulating layer, the length of the first insulating layer is greater than a length of the gate electrode, and the gate electrode is positioned between the source electrode and the drain electrode.

7. The thin film transistor according to claim 6, wherein, in the longitudinal direction of the active layer, a distance between an edge of the gate electrode facing the source electrode and an edge of the first insulating layer facing the source electrode ranges from 0.5 μm to 1.5 μm, and a distance between an edge of the gate electrode facing the drain electrode and an edge of the first insulating layer facing the drain electrode ranges from 0.5 μm to 1.5 μm.

8. The thin film transistor according to claim 6, wherein, in the longitudinal direction of the active layer, a distance between an edge of the source electrode facing the first insulating layer and an edge of the first insulating layer facing the source electrode is greater than or equal to 0.5 μm, and a distance between an edge of the drain electrode facing the first insulating layer and an edge of the first insulating layer facing the drain electrode is greater than or equal to 0.5 μm.

9. The thin film transistor of claim 1, wherein each of the active layer, the first insulating layer, and the gate electrode has an island structure.

10. A method of manufacturing a thin film transistor, comprising:

providing a substrate;

forming an active layer on the substrate;

forming a first insulating layer on a side of the active layer away from the substrate and a gate electrode on a side of the first insulating layer away from the substrate, wherein an orthographic projection of the gate electrode on the first insulating layer is positioned in the first insulating layer or coincides with the first insulating layer;

forming a second insulating layer on the substrate, wherein the second insulating layer covers the active layer, the first insulating layer, and the gate electrode; and forming a source electrode and a drain electrode in a same layer on the second insulating layer, wherein an orthographic projection of the source electrode on the active layer does not overlap with an orthographic projection of the gate electrode on the active layer, an orthographic projection of the drain electrode on the active layer does not overlap with the orthographic projection of the gate electrode on the active layer, and each of the source electrode and the drain electrode passes through the second insulating layer and is electrically connected to the active layer, wherein, in a thickness direction of the substrate, a bottom surface of the source electrode close to the substrate is further from the substrate than a top surface of the gate electrode away from the substrate; and in a width direction of the active layer, a width of the first insulating layer is greater than a width of the gate electrode, the width of the gate electrode is greater than a width of the active layer, the active layer is disposed close to an end of the gate electrode and away from another end of the gate electrode, and the orthographic projection of the gate electrode on the active layer completely covers the active layer.

11. The method of manufacturing the thin film transistor according to claim 10, wherein the orthographic projection of the source electrode on the active layer is separated from the orthographic projection of the gate electrode on the active layer, and the orthographic projection of the drain electrode on the active layer is separated from the orthographic projection of the gate electrode on the active layer.

12. The method of manufacturing the thin film transistor according to claim 11, wherein the orthographic projection of the source electrode on the active layer is separated from an orthographic projection of the first insulating layer on the active layer, and the orthographic projection of the drain electrode on the active layer is separated from the orthographic projection of the first insulating layer on the active layer.

13. The method of manufacturing the thin film transistor according to claim 11, wherein the orthographic projection of the source electrode on the active layer is adjacent to an orthographic projection of the first insulating layer on the active layer, and the orthographic projection of the drain electrode on the active layer is adjacent to the orthographic projection of the first insulating layer on the active layer, and wherein the orthographic projection of the gate electrode on the first insulating layer is positioned in the first insulating layer.

14. The method of manufacturing the thin film transistor according to claim 10, wherein the orthographic projection of the gate electrode on the first insulating layer is positioned in the first insulating layer, the orthographic projection of the gate electrode on the active layer corresponds to a channel region of the active layer, an orthographic projection of a part of the first insulating layer non-overlapping the gate electrode on the active layer corresponds to a transition region of the active layer, and the orthographic projection of the source electrode on the active layer and the orthographic projection of the drain electrode on the active layer correspond to a conductor region of the active layer, and wherein an electrical conductivity of the conductor region is greater than an electrical conductivity of the transition region, and the electrical conductivity of the transition region is greater than an electrical conductivity of the channel region.

15. The method of manufacturing the thin film transistor according to claim 14, wherein, in a longitudinal direction of the active layer, a length of the active layer is greater than a length of the first insulating layer, the length of the first insulating layer is greater than a length of the gate electrode, and the gate electrode is positioned between the source electrode and the drain electrode.

16. The method of manufacturing the thin film transistor according to claim 15, wherein, in the longitudinal direction of the active layer, a distance between an edge of the gate electrode facing the source electrode and an edge of the first insulating layer facing the source electrode ranges from 0.5 μm to 1.5 μm, and a distance between an edge of the gate electrode facing the drain electrode and an edge of the first insulating layer facing the drain electrode ranges from 0.5 μm to 1.5 μm.

17. The method of manufacturing the thin film transistor according to claim 15, wherein, in the longitudinal direction of the active layer, a distance between an edge of the source electrode facing the first insulating layer and an edge of the first insulating layer facing the source electrode is greater than or equal to 0.5 μm, and a distance between an edge of the drain electrode facing the first insulating layer and an edge of the first insulating layer facing the drain electrode is greater than or equal to 0.5 μm.

18. The method of manufacturing the thin film transistor according to claim 10, wherein each of the active layer, the first insulating layer, and the gate electrode has an island structure.

\* \* \* \* \*